(12) United States Patent
Lin et al.

(10) Patent No.: US 9,950,920 B2
(45) Date of Patent: Apr. 24, 2018

(54) MICRO-ELECTRO-MECHANICAL SYSTEM STRUCTURE AND METHOD FOR FORMING THE SAME

(71) Applicant: UNITED MICROELECTRONICS CORP., Hsinchu (TW)

(72) Inventors: Yuan-Sheng Lin, Taoyuan (TW); Weng-Yi Chen, Zhubei (TW); Kuan-Yu Wang, New Taipei (TW); Chih-Wei Liu, Taoyuan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/003,913

(22) Filed: Jan. 22, 2016

(65) Prior Publication Data

US 2017/0210615 A1 Jul. 27, 2017

(51) Int. Cl.
*B81B 3/00* (2006.01)
*B81C 1/00* (2006.01)
*H04R 19/00* (2006.01)

(52) U.S. Cl.
CPC ........ *B81B 3/0075* (2013.01); *B81C 1/00158* (2013.01); *H04R 19/005* (2013.01); *B81B 2201/0257* (2013.01); *B81B 2207/115* (2013.01); *H04R 2201/003* (2013.01); *H04R 2307/027* (2013.01)

(58) Field of Classification Search
CPC ............ H04R 19/005; H04R 2307/027; H04R 2207/115; H04R 2201/003; H04R 2201/0257; B81B 3/0075; B81B 2207/115; B81B 2201/0257; B81C 1/00158

USPC .......................................................... 257/416
See application file for complete search history.

(56) References Cited

U.S. PATENT DOCUMENTS

| | | | |
|---|---|---|---|
| 6,117,767 A * | 9/2000 | Howard ............ | H01L 21/76897 438/637 |
| 7,569,411 B2 | 8/2009 | MacDonald et al. | |
| 7,749,789 B2 | 7/2010 | Papageorgiou | |
| 2007/0284682 A1* | 12/2007 | Laming ............... | B81C 1/00158 257/416 |
| 2010/0155861 A1* | 6/2010 | Zhang ................. | B81C 1/00698 257/415 |
| 2016/0112807 A1* | 4/2016 | Yuan ..................... | H04R 19/04 381/174 |
| 2016/0167946 A1* | 6/2016 | Jenkins ................. | B81B 3/0072 257/416 |
| 2016/0192086 A1* | 6/2016 | Barzen ................. | H04R 19/016 381/355 |

* cited by examiner

*Primary Examiner* — Marc Armand
*Assistant Examiner* — Sue Tang
(74) *Attorney, Agent, or Firm* — WPAT, PC

(57) ABSTRACT

A micro-electro-mechanical (MEMS) structure and a method for forming the same are disclosed. The MEMS structure includes a sacrificial layer, a lower dielectric film, an upper dielectric film, a plurality of through holes and a protective film. The sacrificial layer comprises an opening. The lower dielectric film is on the sacrificial layer. The upper dielectric film is on the lower dielectric film. The plurality of through holes passes through the lower dielectric film and the upper dielectric film. The protective film covers side walls of the upper dielectric film and the lower dielectric film and a film interface between the lower dielectric film and the upper dielectric film.

11 Claims, 4 Drawing Sheets

MICRO-ELECTRO-MECHANICAL SYSTEM STRUCTURE AND METHOD FOR FORMING THE SAME

BACKGROUND

Technical Field

The disclosure relates to a micro-electro-mechanical system structure and a method for forming the same, and more particularly to a microphone and a method for forming the same.

Description of the Related Art

A micro-electro-mechanical system (MEMS) is a micro-electro-mechanical device fabricated in a microminiaturized package structure, and the fabricating technique thereof is quite similar to the technique of fabricating integrated circuits (ICs). However, interactions, for example, about mechanics, optics, or magnetic force between the MEMS device and surrounding environment are more than that of the conventional IC. The MEMS device may include micro-sized electromechanical components, such as motors, pumps, valves, switches, capacitors, accelerometers, sensors, capacitive sensors, pixels, microphones, or actuators, etc. The electromechanical components, which are designed based on capacitance principles, usually work out by the coaction between the mechanical structure and the semiconductor device (e.g. IC), thereby resulting in the displacement of the structure to achieve the anticipated effect.

SUMMARY

According to an embodiment, a micro-electro-mechanical system (MEMS) structure is disclosed, comprising a sacrificial layer, a lower dielectric film, an upper dielectric film, a plurality of through holes and a protective film. The sacrificial layer comprises an opening. The lower dielectric film is on the sacrificial layer. The upper dielectric film is on the lower dielectric film. The plurality of through holes passes through the lower dielectric film and the upper dielectric film. The protective film covers side walls of the upper dielectric film and the lower dielectric film and a film interface between the lower dielectric film and the upper dielectric film.

According to another embodiment, a method for forming a MEMS structure is disclosed, comprising following steps. A sacrificial layer comprising a plurality of pin holes is formed. A lower dielectric film is formed to fill in the plurality of the pin holes of the sacrificial layer and on an upper surface of the sacrificial layer. An upper dielectric film is formed on the lower dielectric film. A plurality of through holes passing through the lower dielectric film and the upper dielectric film is formed. A protective film is formed to cover side walls of the upper dielectric film and the lower dielectric film and a film interface between the lower dielectric film and the upper dielectric film.

BRIEF DESCRIPTION OF THE DRAWINGS

FIG. 2A to FIG. 2F and FIG. 1 illustrate a method for forming a micro-electro-mechanical system structure.

DETAILED DESCRIPTION

In the present disclosure, a micro-electro-mechanical system (MEMS) structure, and a method for manufacturing a MEMS structure are provided, wherein a protective film and/or protruding portions of a lower dielectric film are provided for avoiding structural damage so that the MEMS structure can have desired properties. Embodiments are provided hereinafter with reference to the accompanying drawings for describing the related procedures and configurations, but the present disclosure is not limited thereto. It is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense. The same elements will be remarked with the same symbols in the following description.

Figure 1:
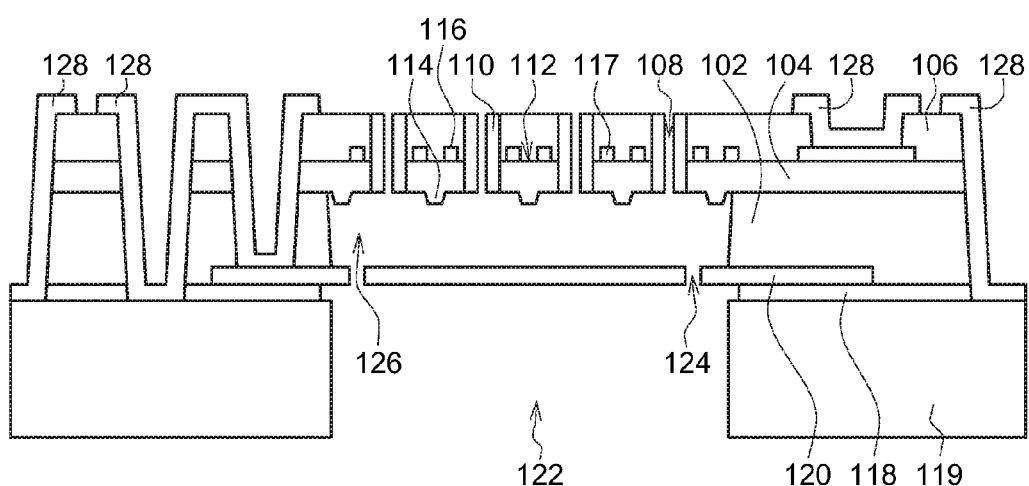
FIG. 1 illustrates a cross-section view of a micro-electromechanical system structure.

FIG. 1 illustrates a cross-section view of a micro-electromechanical system (MEMS) structure, for example a microphone, according to an embodiment.

Referring to FIG. 1, the MEMS structure comprises a sacrificial layer 102, a lower dielectric film 104, an upper dielectric film 106 and a protective film 110. The lower dielectric film 104 is on the sacrificial layer 102. The upper dielectric film 106 is on the lower dielectric film 104.

As shown in FIG. 1, the lower dielectric film 104 and the upper dielectric film 106 have a film interface 112 there between. In embodiments, the film interface 112 between the upper dielectric film 106 and the lower dielectric film 104 may be resulted from separate processes or discontinuous processes for the upper dielectric film 106 and the lower dielectric film 104; or resulted from different materials of the upper dielectric film 106 and the lower dielectric film 104.

Referring to FIG. 1, the protective film 110 covers side walls of the upper dielectric film 106 and the lower dielectric film 104 and the film interface 112 between the lower dielectric film 104 and the upper dielectric film 106, exposed by through holes 108 passing through the lower dielectric film 104 and the upper dielectric film 106. In an embodiment, the lower dielectric film 104 and the upper dielectric film 106 are used as a back-plate for a microphone. The through holes 108 in the lower dielectric film 104 and the upper dielectric film 106 communicate with an opening 126 of the sacrificial layer 102.

As shown in FIG. 1, the lower dielectric film 104 may comprise protruding portions 114 beyond a lower surface of the protective film 110. The protruding portions 114 of the lower dielectric film 104 are under the film interface 112 between the lower dielectric film 104 and the upper dielectric film 106.

Referring to FIG. 1, a conductive pattern 116 may be between the lower dielectric film 104 and the upper dielectric film 106. The conductive pattern 116 may comprise a conductive mesh 117 distributed among the through holes 108 in the lower dielectric film 104 and the upper dielectric film 106.

Referring to FIG. 1, an insulating layer 118 may be on a substrate 119. A conductive diagram 120 comprising apertures 124 communicating with the opening 126 of the sacrificial layer 102 may be on the insulating layer 118. The substrate 119 and the insulating layer 118 may comprise a cavity 122 communicating with the apertures 124 of the conductive diagram 120. A conductive layer 128 may be electrically connected to the conductive pattern 116 and/or the conductive diagram 120.

FIG. 2A to FIG. 2F and FIG. 1 illustrate a process flow for forming the MEMS structure as shown in FIG. 1 according to an embodiment.

Figure 2A:
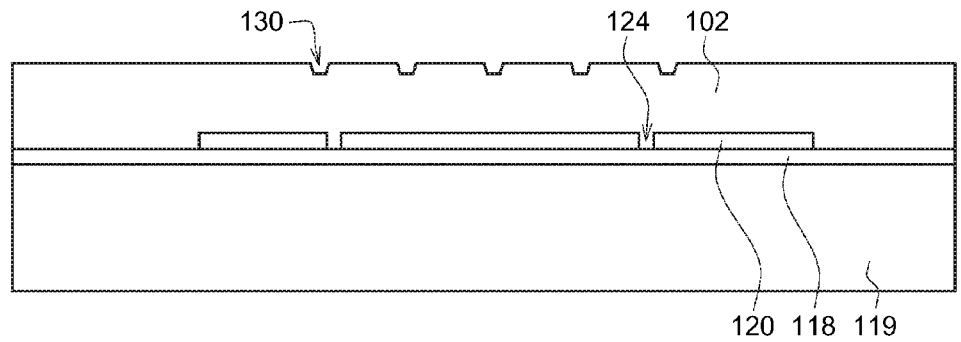

Referring to FIG. 2A, the substrate 119 is provided. The substrate 119 may comprise Si, or other suitable materials or structures, such as a silicon on insulator (SOI), etc. The insulating layer 118 may be formed on the substrate 119. The insulating layer 118 may comprise silicon oxide, or other suitable dielectric materials, such as silicon nitride, silicon oxynitride, etc. The conductive diagram 120 may be formed on the insulating layer 118. The conductive diagram 120 may comprise polysilicon, or other suitable conductive materials. The apertures 124 may be formed in the conductive diagram 120, for example, by a method comprising a lithography process and then an etching process. For example, the etching process may comprise a dry etching, a wet etching, or other suitable methods. The sacrificial layer 102 may be formed to fill in the apertures 124 and on upper surfaces of the conductive diagram 120 and the insulating layer 118. Pin holes 130 may be formed in the sacrificial layer 102, for example by etching from an upper surface of the sacrificial layer 102, for example by a method comprising a lithography process and then an etching process. For example, the etching process may comprise a dry etching, a wet etching, or other suitable methods.

Figure 2B:
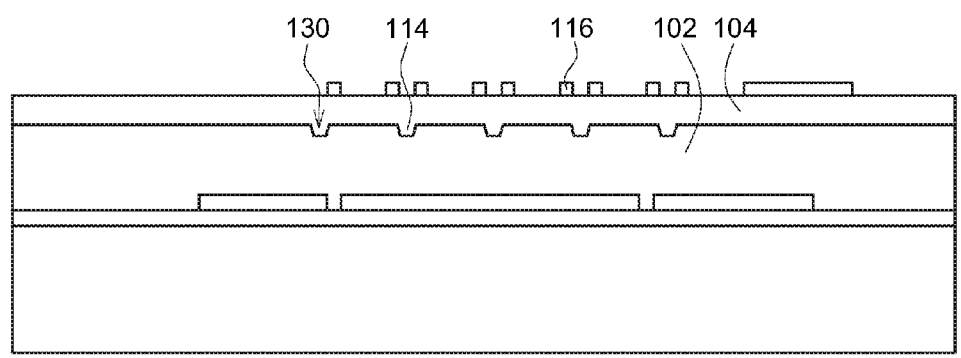

Referring to FIG. 2B, the lower dielectric film 104 may be formed to fill in the pin holes 130 of the sacrificial layer 102 and on the upper surface of the sacrificial layer 102. A portion of the lower dielectric film 104 filling in the pin holes 130 of the sacrificial layer 102 forms the protruding portions 114 of the lower dielectric film 104. The lower dielectric film 104 may comprise an oxide, a nitride, an oxynitride, for example silicon oxide, silicon nitride, silicon oxynitride, or other suitable dielectric materials. The conductive pattern 116 may be formed on the lower dielectric film 104, for example by a method comprising depositing a conductive material, and a lithography process and an etching process applied to the conductive material. The conductive pattern 116 may comprise a metal, such as aluminum, copper, gold, or other suitable metals or alloys.

Figure 2C:
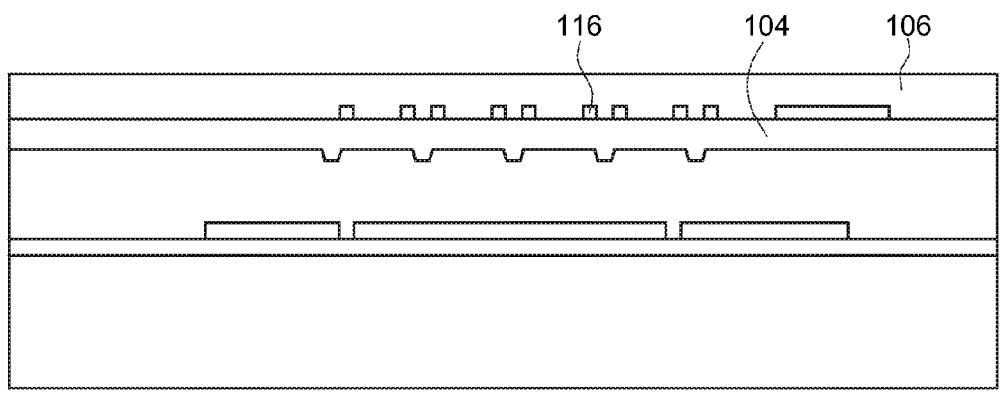

Referring to FIG. 2C, the upper dielectric film 106 may be formed on the lower dielectric film 104 and the conductive pattern 116. The upper dielectric film 106 may comprise an oxide, a nitride, an oxynitride, for example silicon oxide, silicon nitride, silicon oxynitride, or other suitable dielectric materials.

Figure 2D:
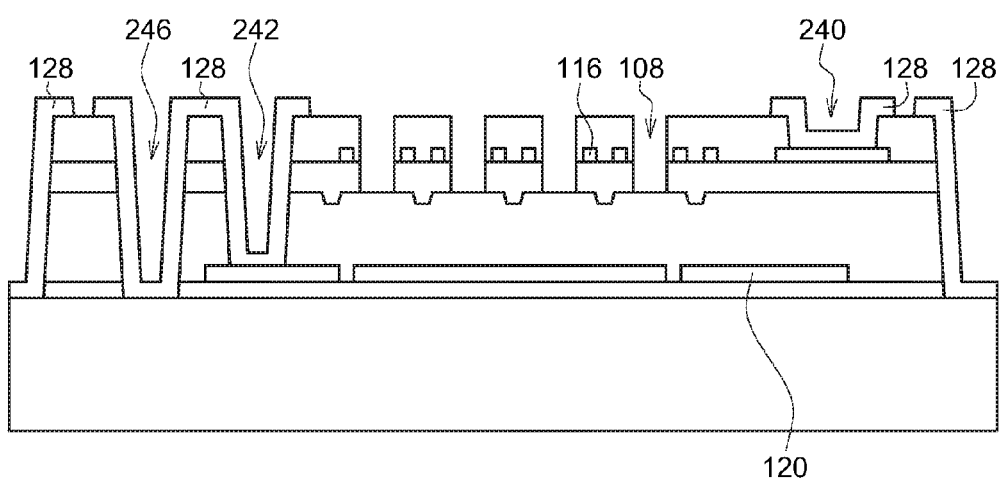

Referring to FIG. 2D, the through holes 108, and through holes 240, 242, 246, having different depths from each other, may be formed by an etching method. The conductive layer 128 may be formed in the through holes 240, 242, 246 to electrically connect to the conductive pattern 116 and/or the conductive diagram 120.

Figure 2E:
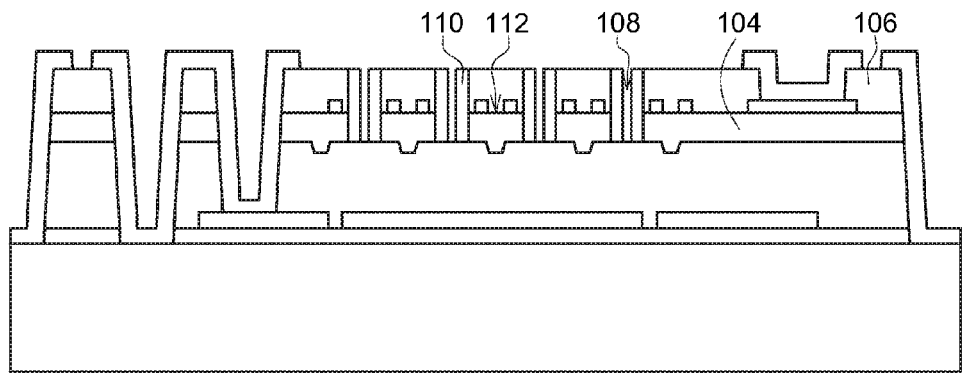

Referring to FIG. 2E, the protective film 110 may be formed in the through holes 108 passing through the upper dielectric film 106 and the lower dielectric film 104 to cover the side walls of the upper dielectric film 106 and the lower dielectric film 104 and cover the film interface 112 between the lower dielectric film 104 and the upper dielectric film 106.

Figure 2F:
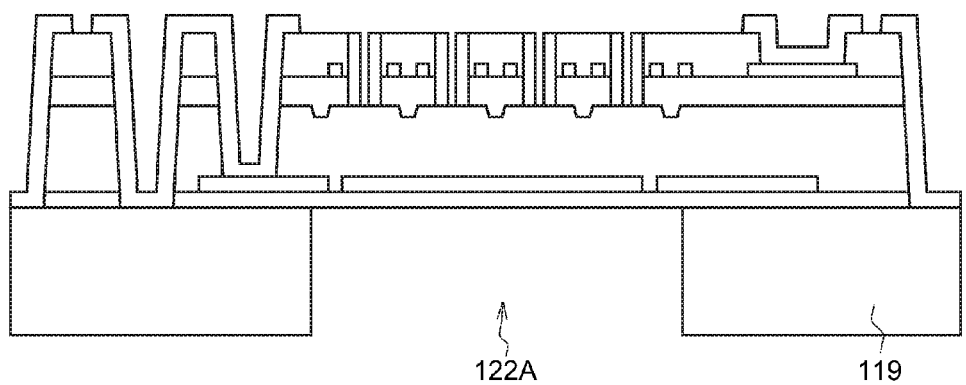

Referring to FIG. 2F, a portion of the substrate 119 is removed to form a cavity 122A, for example, by an etching method, such as a dry etching method, a wet etching method, or other suitable methods.

Referring to FIG. 1, a portion of the insulating layer 118 is removed to form a cavity 122. A portion of the sacrificial layer 102 is removed to form the opening 126. In embodiments, the sacrificial layer 102 may be removed with an etchant having a high etching selectivity between the sacrificial layer 102 and the protective film 110, so that during the etching process, the protective film 110 can be remained on the lower dielectric film 104, the upper dielectric film 106, and the film interface 112 between the lower dielectric film 104 and the upper dielectric film 106, to protect the lower dielectric film 104 and the upper dielectric film 106 from peeling or lateral etching that would especially easily occur from the film interface 112 between lower dielectric film 104 and the upper dielectric film 106 if no protective film 110 is present. Since a back-plate of a microphone, comprising the lower dielectric film 104 and the upper dielectric film 106, is not damaged with the protecting effect from the protective film 110, the microphone can have desired acoustic characteristics.

Various kinds of the sacrificial layer 102, the protective film 110, and the etchant may be properly chosen as long as the protective film 110 can be remained for providing the protecting effect during etching the opening 126 in the sacrificial layer 102.

In an embodiment, for example, the lower dielectric film 104 and the upper dielectric film 106 both comprise silicon nitride (PESIN). The sacrificial layer 102 comprises silicon oxide (SiO2). The protective film 110 comprises SiN (Si-rich nitride). The opening 126 is formed in the sacrificial layer 102 by using a HF etching solution. During the HF etching process, the protective film 110 can avoid peeling or lateral etching that would easily occur at the film interface 112 between the lower dielectric film 104 and the upper dielectric film 106 if no protective film 110 is present.

In an embodiment, after the HF etching step for forming the opening 126 in the sacrificial layer 102, the structure as shown in FIG. 1 may be cleaned with water to rid of the residual HF etchant, and then be dried. The protruding portions 114 of lower dielectric film 104 can decrease a contact area, and then reduce an adhesion between the lower/upper dielectric film 106 and the conductive diagram 120 resulted from the gradually-decreased water during the drying process and therefore can avoid structural deformation due to the adhesion. Since the structure as shown in FIG. 1 is not damaged with the protecting effect from protruding portions 114 of lower dielectric film 104, the microphone can have desired acoustic characteristics.

According to embodiments, the MEMS structure and the method for forming the same are disclosed, wherein the protective film is provided to cover the lower dielectric film, the upper dielectric film, and the film interface between the lower dielectric film and the upper dielectric film so that the lower dielectric film, the upper dielectric film, and especially the film interface would not be damaged during etching process for removing the elements other than the lower dielectric film and the upper dielectric film. Moreover, the protruding portions of the lower dielectric film can avoid structural deformation resulted from an adhesion between the back-plate (i.e. the lower dielectric film and the upper dielectric film) and the conductive diagram occurring during a drying step for removing a residue solution. Therefore, the MEMS structure can have desired performance characteristics. For example, a microphone can have excellent acoustic efficiency.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broad-

What is claimed is:

1. A micro-electro-mechanical system (MEMS) structure, comprising:
    a sacrificial layer comprising an opening;
    a lower dielectric film on the sacrificial layer;
    an upper dielectric film on the lower dielectric film;
    a plurality of through holes passing through the lower dielectric film and the upper dielectric film; and
    a protective film covering side walls of the upper dielectric film and the lower dielectric film and a film interface between the lower dielectric film and the upper dielectric film,
    wherein a silicon content of a silicon nitride in the protective film is larger than a silicon content of a silicon nitride in the lower dielectric film and a silicon content of a silicon nitride in the upper dielectric film.

2. The MEMS structure according to claim 1, further comprising a conductive pattern between the lower dielectric film and the upper dielectric film.

3. The MEMS structure according to claim 2, wherein the conductive pattern comprising a conductive mesh distributed among the through holes in the lower dielectric film and the upper dielectric film.

4. The MEMS structure according to claim 2, further comprising a conductive layer electrically connecting with the conductive pattern.

5. The MEMS structure according to claim 1, wherein the lower dielectric film comprises a plurality of protruding portions beyond a lower surface of the protective film.

6. The MEMS structure according to claim 5, wherein the plurality of the protruding portions of the lower dielectric film is under the film interface between the lower dielectric film and the upper dielectric film.

7. The MEMS structure according to claim 1, further comprising a conductive diagram comprising a plurality of apertures communicating with the opening of the sacrificial layer.

8. The MEMS structure according to claim 7, further comprising a substrate and an insulating layer on the substrate, wherein the conductive diagram is on the insulating layer.

9. The MEMS structure according to claim 8, wherein the substrate and the insulating layer comprising a cavity communicating with the plurality of the apertures of the conductive diagram.

10. The MEMS structure according to claim 7, further comprising a conductive layer electrically connecting with the conductive diagram.

11. The MEMS structure according to claim 1, wherein the lower dielectric film and the upper dielectric film are used as a back-plate for a microphone.

* * * * *